(12) United States Patent
Chung

(10) Patent No.: US 6,833,303 B2
(45) Date of Patent: Dec. 21, 2004

(54) METHOD FOR FORMING SEMICONDUCTOR DEVICE

(75) Inventor: Eun-young Chung, Chungcheongnam-do (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 13 days.

(21) Appl. No.: 10/615,045

(22) Filed: Jul. 8, 2003

(65) Prior Publication Data

US 2004/0009435 A1 Jan. 15, 2004

(30) Foreign Application Priority Data

Jul. 12, 2002 (KR) .................. 10-2002-0040710

(51) Int. Cl.$^7$ ......................................... H01L 21/8242
(52) U.S. Cl. ..................................... 438/243; 438/246
(58) Field of Search ......................... 438/197, 238–249

(56) References Cited

U.S. PATENT DOCUMENTS 6,177,696 B1    1/2001   Bronner et al.
6,200,873 B1    3/2001   Schrems et al.

Primary Examiner—Evan Pert
(74) Attorney, Agent, or Firm—Marshall, Gerstein & Borun LLP

(57) ABSTRACT

The present invention discloses a method for forming a semiconductor device which increases capacitance by forming a structure of a trench capacitor and uses an inner side face of the capacitor as a capacitor region.

5 Claims, 5 Drawing Sheets

METHOD FOR FORMING SEMICONDUCTOR DEVICE

BACKGROUND OF THE INVENTION

1. Field of the Invention

The present invention relates to a method for forming a semiconductor device, and more particularly to, a method for forming a semiconductor device which can achieve a high capacitance in a small area by implementing a trench-type capacitor while using a conventional MPDL manufacturing process.

2. Description of the Related Art

As integration of a semiconductor device increases, the size of the cells gets smaller. Therefore, it is more difficult to form a capacitor having a sufficient capacitance. Particularly, in case of a DRAM device constructed with one MOS transistor and capacitor, word lines and bit lines are orthogonally arranged on a semiconductor substrate in longitudinal and transverse directions. The capacitor is formed across two gates and a contact hole is formed on the center of the capacitor. At this time, the above-mentioned capacitor is mostly made of a polycrystalline silicon layer as a conductive material and an oxide film, a nitride film or a laminated film thereof such as an ONO (oxide-nitride-oxide) film as a dielectric material. It is key key for high integration of a DRAM device to reduce the size of a chip while the capacitance, which occupies large area of a chip, is kept large.

FIGS. 1a to 1d are cross-sectional views for illustrating a method for forming a semiconductor device in accordance with the prior art.

Referring to FIG. 1a, a pad oxide film 11 and a nitride film 12 are deposited on a silicon substrate 10 and thereafter a trench structure having an angle of 77° is formed thereon by photo etching and dry etching. Then, an oxide film 13 is deposited and insulation is provided by CMP planarization.

Referring to FIG. 1b, after performing an implant process for forming a well (not shown) and a cell Vt implant and capacitor Vt implant process are carried out. Then, a gate oxide film 14 for forming a gate is formed, a doped silicon 15 is deposited, and then a photoresist pattern 16 is formed.

Referring to FIG. 1c, a dry etching is performed using the photoresist pattern 16 as a mask to thus form a planer capacitor 17 and a gate 18.

Referring to FIG. 1d, after deposition of IPO (Inter Poly Oxide) 19, a metal contact is formed through photo etching and dry etching and then a bit line 20 is formed. By carrying out a wiring process, a MPDL cell is manufactured.

However, such a MPDL cell according to the prior art is problematic in that a capacitor area with a large area is required for implementing a higher capacitor value to secure an operation margin of a sensor and improve refresh characteristics by increasing the sensing margin.

SUMMARY OF THE INVENTION

The present invention is designed in consideration of the problems of the prior art, and therefore it is an object of the present invention to provide a method for forming a semiconductor device which increases capacitance by forming a structure of a trench capacitor and using an inner side face of the capacitor as a capacitor region.

To achieve the above object, there is provided a method for forming a semiconductor device in accordance with the present invention, comprising the steps of: depositing a pad oxide film and a nitride film on a silicon substrate, forming a 77 angle trench by photo etching and dry etching, depositing a HLD oxide film and then insulating the device; performing a cell Vt implant process on the resulting material and then forming a first photoresist pattern for adjusting the capacitor Vt; defining a capacitor region by performing dry etching using the HLD oxide film and the first photoresist pattern as a barrier layer; performing an implant process on the resulting material; forming a gate oxide film on the resulting material, depositing a doped poly and forming a second photoresist pattern; forming a trench capacitor and a gate by photo etching and dry etching using the second photoresist pattern; and depositing an interlayer film on the resulting material, planarizing the same, forming a metal contact and performing a bit line and wiring process thereon.

At this time, the dry etching process for defining the capacitor region is performed at 80 to 90 degrees.

After the defining the capacitor region, a cleaning process is performed with an ammonia-based cleaning solution.

By performing an additional dry etching process using the HLD oxide film and the first photoresist pattern as a barrier layer, four inside surfaces of the capacitor are all defined as the capacitor region to thus increase the capacitance of the capacitor.

When performing the implant process on the resulting material on which the capacitor region is defined, a tilt implant process is performed to implant a dopant evenly on the side faces and bottom of the trench capacitor.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Figure 1A:
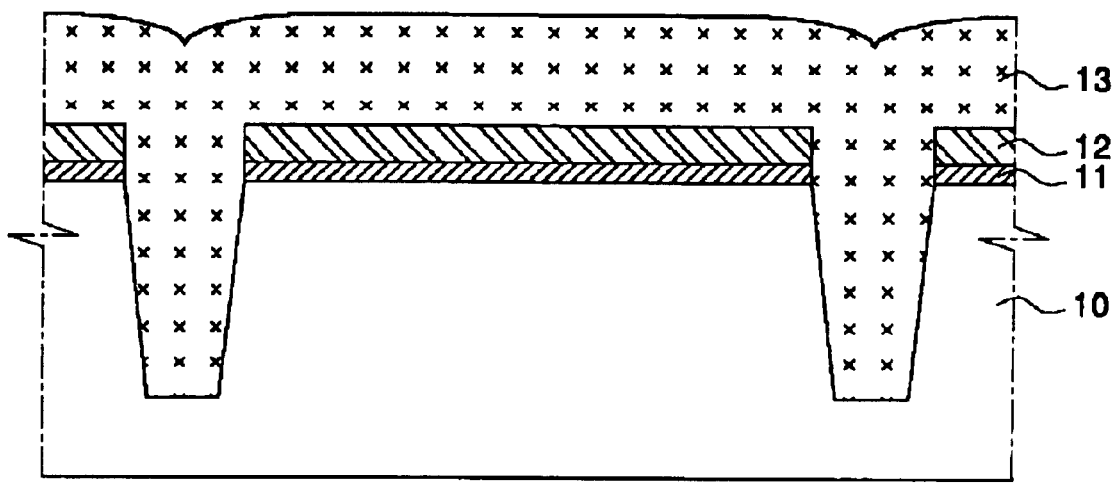
FIGS. 1a to 1d are cross-sectional views for illustrating a method for forming a semiconductor device in accordance with the prior art.
Figure 1B:
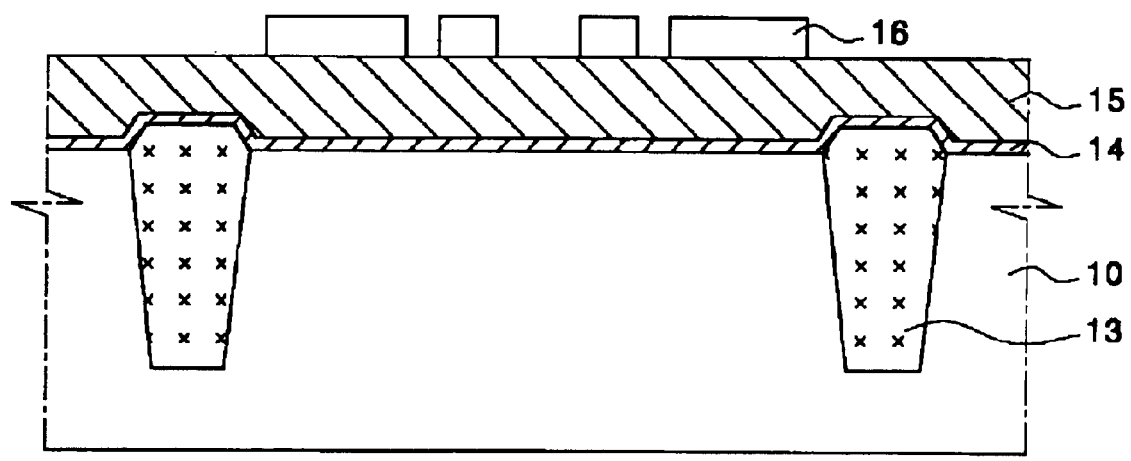
Figure 1C:
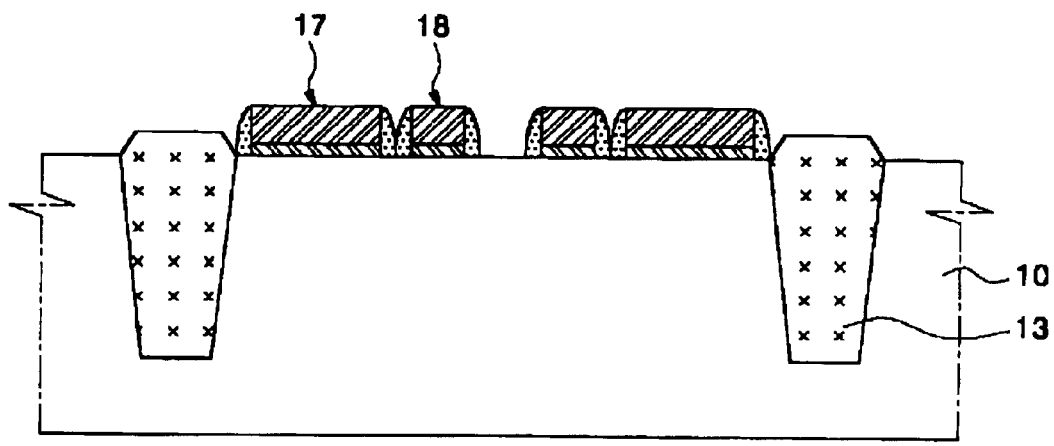
Figure 1D:
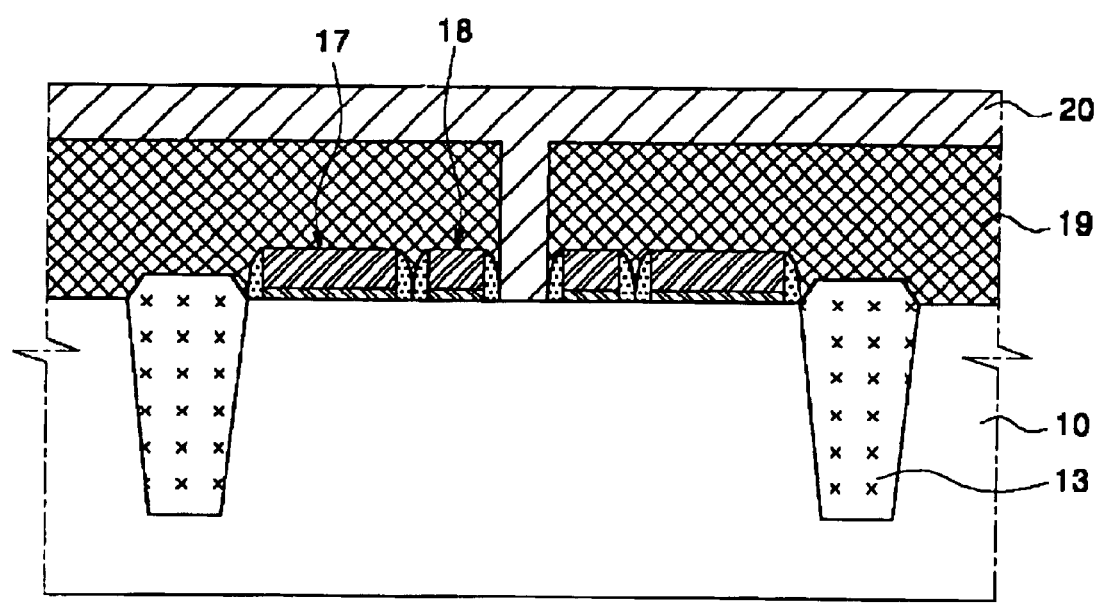

Hereinafter, a preferred embodiment of the present invention will be described in more detail referring to the drawings. In addition, the following embodiment is for illustration only, not intended to limit the scope of the invention, and identical components to the conventional art use the identical references numeral and names.

FIGS. 2a to 2f are cross sectional views for illustrating a method for forming a semiconductor device in accordance with the present invention.

Figure 2A:
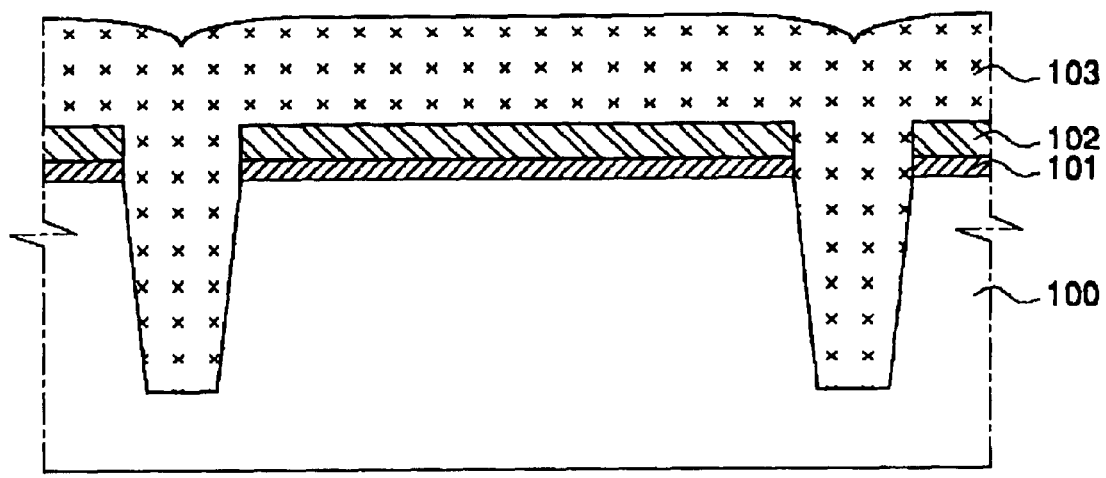
FIGS. 2a to 2f are cross sectional views for illustrating a method for forming a semiconductor device in accordance with the present invention.

Referring to FIG. 2a, a pad oxide film 101 and a nitride film 102 are deposited on a silicon substrate 100 and thereafter a trench structure having an angle of 77° is formed thereon by photo etching and dry etching. Then, an HLD oxide film 103 is deposited and device insulation is carried out by CMP planarization.

Figure 2B:
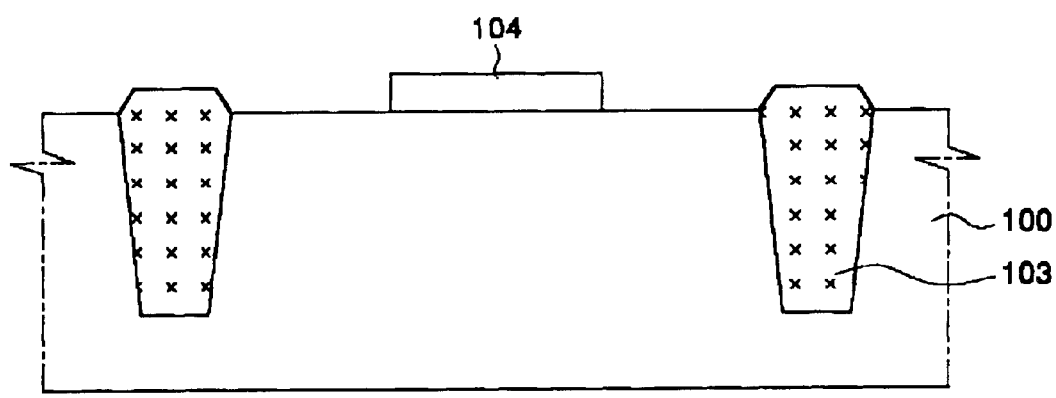

Referring to FIG. 2b, after performing a cell Vt implant process by photo etching, a first photoresist pattern 104 is formed for adjusting a capacitor Vt.

Figure 2C:
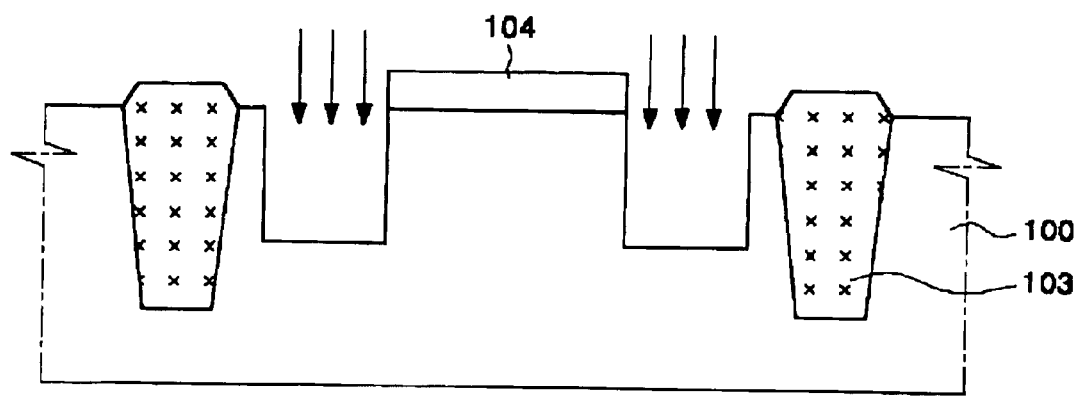

Referring to FIG. 2c, a capacitor region is defined by performing dry etching at 80 to 90 degrees. C. using the HLD oxide film 103 and the first photoresist pattern 104 as a barrier layer. Then, a cleaning process is performed with an ammonia-based cleaning solution to even out the roughness of the silicon substrate 100.

At this time, by performing an additional dry etching process using the HLD oxide film 103 and the first photoresist pattern 104 as a barrier layer, four inside surfaces of the capacitor can be all defined as the capacitor region, thereby increasing the capacitance of the capacitor.

The implant process is continuously performed at a tilt. The reason why a tilt implant process is performed is to implant a dopant uniformly on the bottom and side faces of a trench capacitor.

At this time, the more similar a grid array surface of a silicon wafer at the bottom and side faces of a trench structure have, the more similar their gate oxygenation ratio becomes. This makes it possible to form a uniform gate oxide film, thus dry etching of 80 to 90 degrees is performed in the formation of a trench capacitor.

The formed trench-type capacitor can increase the capacitance using an inner side face of the capacitor as the capacitor region. By increasing the capacitance, it is possible to increase the sensing margin, secure an operation margin of a sensor and improve refresh characteristics.

Figure 2D:
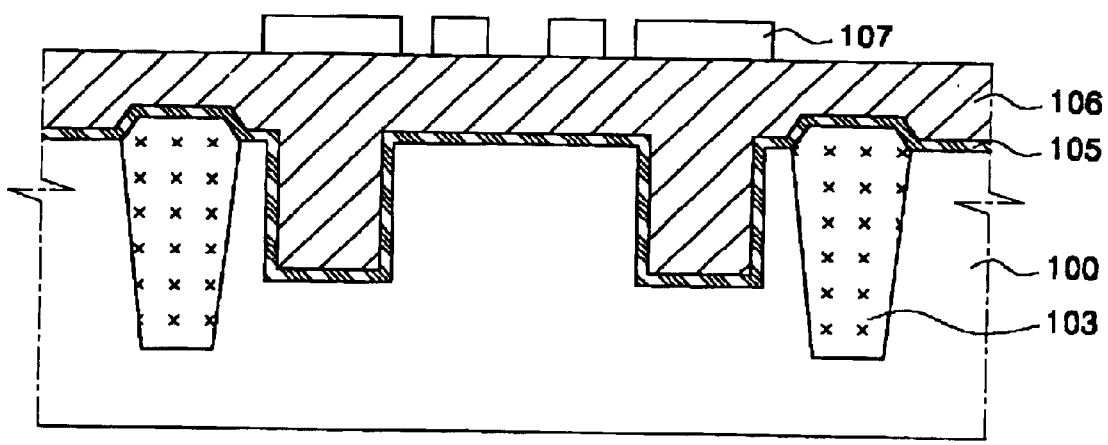

Referring to FIG. 2d, a gate oxide film 105 is formed, then a doped poly 106 is deposited, and then a second photoresist pattern 107 is formed.

Figure 2E:
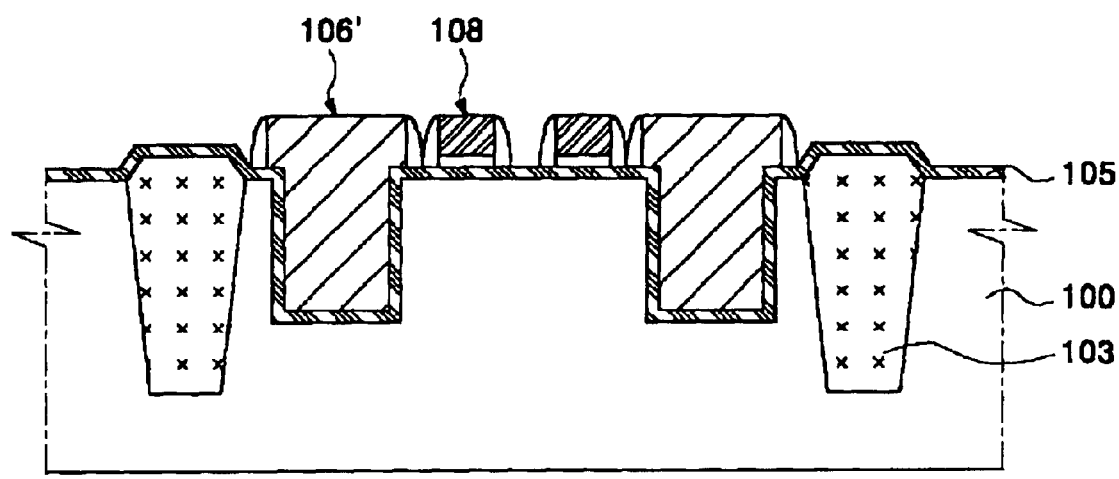

Referring to FIG. 2e, a trench capacitor 106' and a gate 108 are formed by photo etching and dry etching using the second photoresist pattern 107.

Figure 2F:
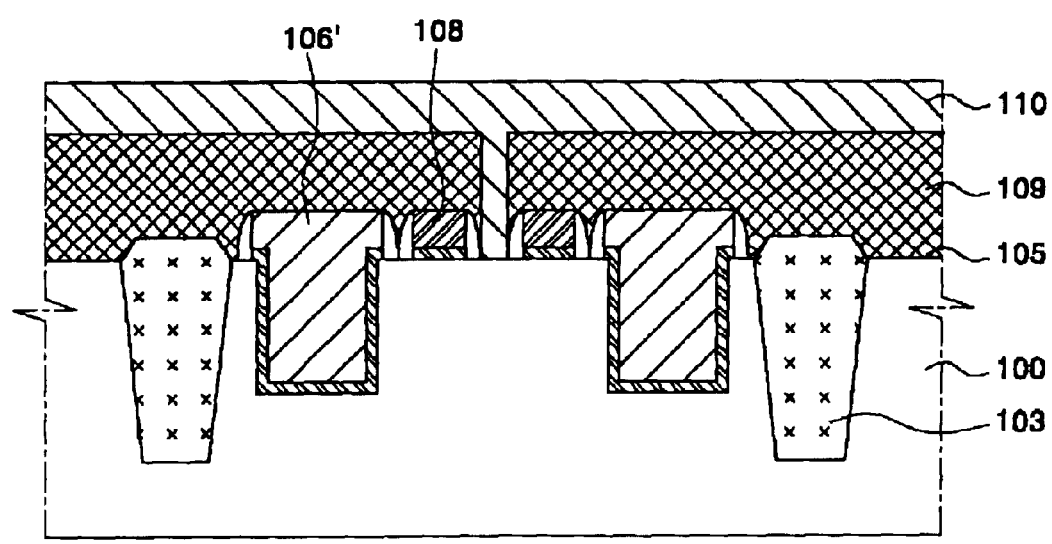

Referring to FIG. 2f, an interlayer film 109, i.e., an IPO (Inter Poly Oxide), is deposited and planarized. Next, a metal contact is formed by a photo etching and dry etching process, and then a bit line 110 and wiring process is performed thereon.

As described above, in this invention, a high capacitance can be obtained in a small area by forming a trench type capacitor while maintaining a conventional MPDL manufacturing process as is. Moreover, by implementing a higher capacitor value while maintaining the existing process as is, the sensing margin is increased thereby securing an operation margin of a sensor and improving refresh characteristics.

Furthermore, this invention is applicable to manufacture a product having a large capacitance in a small area, a high integrated capacitor or a SoC device.

What is claimed is:

1. A method for forming a semiconductor device, comprising the steps of:

depositing a pad oxide film and a nitride film on a silicon substrate, forming a 77° angle trench by photo etching and dry etching, depositing a HLD oxide film and then performing device insulation;

performing a cell Vt implant process on the resulting material and then forming a first photoresist pattern for adjusting a capacitor Vt;

defining a capacitor region by performing dry etching using the HLD oxide film and the first photoresist pattern as a barrier layer;

performing an implant process on the resulting material;

forming a gate oxide film on the resulting material, depositing a doped poly and forming a second photoresist pattern;

forming a trench capacitor and a gate by photo etching and dry etching using the second photoresist pattern; and depositing an interlayer film on the resulting material, planarizing the same, forming a metal contact and performing a bit line and wiring process thereon.

2. The method of claim 1, wherein the dry etching process for defining the capacitor region is performed at 80 to 90 degrees.

3. The method of claim 1, wherein a cleaning process is performed with an ammonia-based cleaning solution after definition of the capacitor region.

4. The method of claim 1, wherein four inside surfaces of the capacitor are all defined as a capacitor region to thus increase the capacitance of the capacitor by performing an additional dry etching process using the HLD oxide film and the first photoresist pattern as a barrier layer.

5. The method of claim 1, wherein a tilt implant process is performed in order to implant a dopant uniformly on the side faces and bottom of the trench capacitor when the implant process is performed on the resulting material on which the capacitor region is defined.

* * * * *